United States Patent [19]
Besson

[11] 4,257,117
[45] Mar. 17, 1981

[54] ELECTRONIC WATCH WITH TOUCH-SENSITIVE KEYS

[75] Inventor: Rene Besson, Neuchatel, Switzerland

[73] Assignee: Ebauches S.A., Neuchatel, Switzerland

[21] Appl. No.: 27,068

[22] Filed: Apr. 4, 1979

[30] Foreign Application Priority Data

Apr. 11, 1978 [CH] Switzerland .......................... 3863/78

[51] Int. Cl.³ ...................... G04C 17/00; G04C 19/00; G04C 21/00; G04B 17/12
[52] U.S. Cl. .................................... 368/69; 368/185; 368/321; 307/116; 340/365 C; 200/DIG. 1
[58] Field of Search ................ 58/23 R, 50 R, 23 BA; 200/DIG. 1; 307/116; 340/365 C; 368/69, 70, 185, 187, 321

[56] References Cited

U.S. PATENT DOCUMENTS

| | | | |
|---|---|---|---|
| 3,810,356 | 5/1974 | Fujita | 58/23 R |
| 3,983,690 | 10/1976 | McClintock | 58/50 R |
| 4,047,010 | 9/1977 | Perotto et al. | 235/156 |
| 4,063,111 | 12/1977 | Dobler et al. | 307/116 |
| 4,091,610 | 5/1978 | Sasaki et al. | 58/23 R |

*Primary Examiner*—J. V. Truhe
*Assistant Examiner*—John B. Conklin
*Attorney, Agent, or Firm*—Silverman, Cass & Singer, Ltd.

[57] ABSTRACT

Touch sensitive key switches of an electronic watch which control functions of the watch such as time setting, are gated to reduce the power consumption of the watch. The key switches are capacitive and are fed signals derived from the time standard oscillator of the watch. A change in the key switch signals when the switches are touched by the user activate the time setting functions. Gates are provided coupling the signals derived from the oscillator to the key switches so that the signals are applied to the key switches either under control of the user or during repetitive time periods, reducing the time the signals are applied to the key switches and the power necessary to continuously supply such signals to the key switches.

6 Claims, 2 Drawing Figures

ELECTRONIC WATCH WITH TOUCH-SENSITIVE KEYS

BACKGROUND OF THE INVENTION

The present invention relates to an electronic watch of the type using touch-sensitive keys or key switches for selecting and controlling the watch functions.

Touch-sensitive or contactless key switch devices are now used to replace the conventional push-button contact switch systems used for selecting and controlling the functions of an electronic watch such as time setting, switch on and off the chronograph function, etc. Known touch-sensitive key switch devices include a transparent electrode disposed on the inner face of the crystal of the watch and permanently connected to the oscillating circuit or the frequency divider of the watch. A circuit is provided to use the signals which are produced when the user puts his finger onto the crystal opposite the electrode.

A number of keys (two or three) are often provided in the watch. As the keys are permanently energized, the power consumption is relatively high and, consequently, the lifetime of the watch battery is substantially reduced.

Accordingly, it is an object of the present invention to reduce the consumption of current in watches using touch-sensitive keys.

SUMMARY OF THE INVENTION

The electronic watch of the invention provides gating, controlling the application to touch-sensitive key switches of feed signals derived from an oscillator of the watch. The watch has a time standard oscillator providing a standard oscillating signal, a frequency divider coupled to the oscillating signal providing a reduced frequency time signal, a time display displaying time information in response to the time signal and a time correction circuit connected to the frequency divider to change the time displayed by the watch in response to an activation signal. The touch-sensitive key switches produce the activation signal in response to a human touch during the period in which they have the feed signals applied to them. The gates apply the feed signals to the key switches in response to a control signal produced by such as a human touch on a selected continuously fed touch-sensitive key switch or in response to a repetitive signal derived from the frequency divider. The gating thus applies the feed signals to the key switches only on demand or intermittently reducing the power otherwise required to continually apply the feed signals to the key switches.

BRIEF DESCRIPTION OF THE DRAWINGS

For a better understanding of the invention, reference is made to the following description, taken in connection with the accompanying drawings, in which.

DESCRIPTION OF THE PREFERRED EMBODIMENTS

Figure 1:
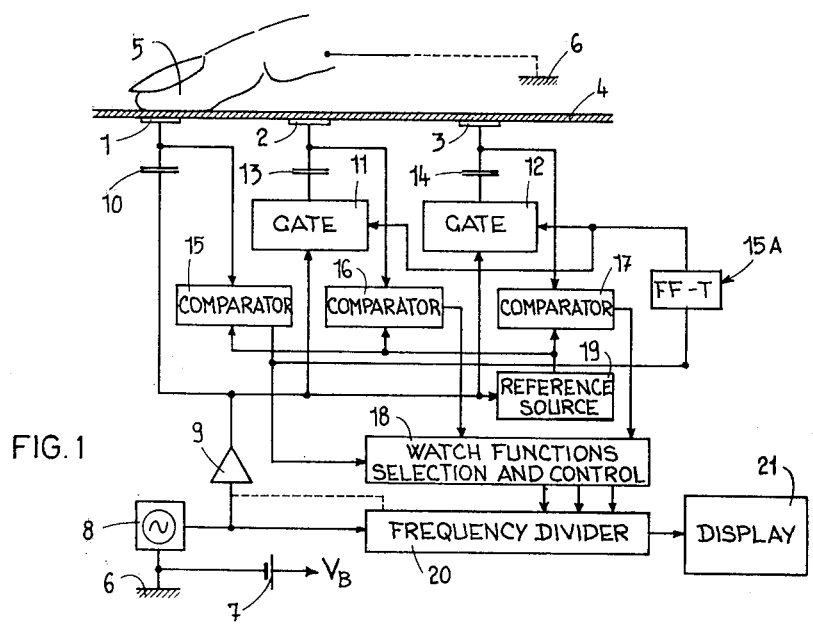
FIG. 1 represents schematically a first embodiment of an electronic watch according to the invention.

The electronic watch shown on FIG. 1 comprises, as does any conventional electronic watch, a time standard oscillator circuit 8, a frequency divider 20 for reducing the frequency of the oscillator signal and a time display 21 driven by the frequency divider. The watch also includes three touch-sensitive or contactless key switches 1, 2 and 3, in the form of thin metallic plates located under the watch crystal 4. Each of these plates which is stationary forms one of the electrodes of three different capacitors. The other electrode of each capacitor is constituted by the finger 5 of the user when touching the crystal 4 opposite the keys 1, 2 or 3. A battery 7 has one terminal connected to the watch casing 6 itself in contact with the body of the user. The other terminal $V_B$ of the battery is connected to the circuits of the watch.

The key 1 is connected to the oscillator 8 through an amplifier 9 and a coupling capacitor 10. The other keys 2 and 3 are connected to oscillator 8 through gate circuits 11 and 12, respectively, and coupling capacitors 13 and 14, respectively. The signal appearing on each key 1, 2 or 3 is applied to the input of a voltage comparator 15, 16 or 17, respectively, the reference input of which receives a reference voltage produced by a source 19 from the output signal of amplifier 9. The output of each comparator is applied to one input of a circuit 18 for selecting and controlling the functions of the watch. Circuit 8 has several outputs (three outputs are shown on FIG. 1) which are connected to frequency divider 20. Each output is activated by activating the inputs with an activation signal (from comparators 15-16-17) according to a predetermined code. Circuit 18 can be of the type disclosed in U.S. Pat. No. 3,810,356. As shown by the dashed line in FIG. 1, amplifier 9 can be connected to the frequency divider 20 instead of to the oscillator 8.

The output of comparator 15 only is also connected to the control input of a T type flip-flop 15A, which changes its state each time a pulse is applied to said input. The input of flip-flop 15A is connected to the control inputs of gates 11 and 12. These gates may be AND gates whose two inputs are respectively connected to the output of amplifier 9 and the output of flip-flop 15A.

In operation, when the user wishes to have access to circuit 18, he first puts his finger on key switch 1 which is permanently connected or coupled to oscillator 8. As a result, comparator 5 sends a pulse or control signal to flip-flop 15A, whose output, initially in the "0" state, goes to "1" and activates gates 11 and 12. Keys 2 and 3 are thus connected or coupled to oscillator 8 and can be actuated to activate the inputs of circuit 18. Each time the user puts his finger on one of these keys, the voltage comparator 16 or 17 activates the corresponding input of circuit 18. Once the user has set his watch, he touches key switch 1 which set flip-flop 15A to "0", thus disconnecting keys 12 and 13 from oscillator 8.

As key switch 1 only is permanently connected to oscillator 8, the lifetime of battery 7 can be substantially increased.

Figure 2:
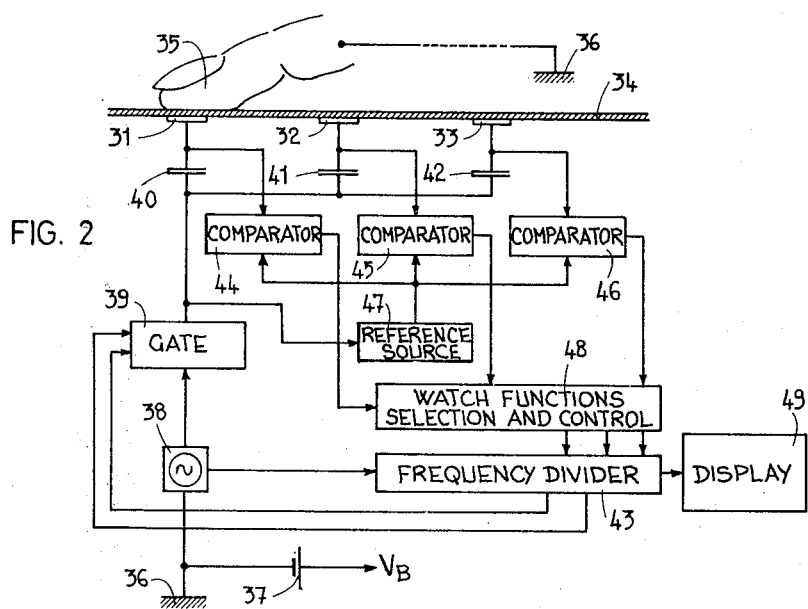
FIG. 2 represents a second embodiment of an electronic watch according to the invention.

FIG. 2 represents a second embodiment of an electronic watch according to the invention. The watch has three-sensitive key switches with a capacitive effect 31, 32 and 33, which are located under the crystal 34 of the watch. A battery 37 has one terminal connected to the casting 36 of the watch itself in contact with the body of the user). The other terminal $V_B$ of the battery is connected to the circuits of the watch.

The watch also comprises a time standard oscillator 38, a frequency divider 43 for reducing the frequency of the oscillator signal and time display means 49 driven by the frequency divider.

Key switches 31, 32 and 33 are fed by oscillator 38 through a gate circuit 39 and coupling capacitors 40, 41 and 42, respectively. Circuit 39 can be constituted by a flip-flop whose two inputs are coupled respectively to different stages of frequeny divider 43 in order to connect the key switches to the oscillator only during predetermined intervals of time. Typically, the key switches are connected to oscillator 38 every 31 ms (milliseconds) for a period of 7.8 ms, which corresponds to a duty cycle of 1:4. The signal which appears on each key switch 31, 32 or 33 when touched by the user is applied to the input of a voltage comparator 44, 45 or 46, respectively, and is compared with a reference voltage produced by a source 47 from the output signal of oscillator 38. Each comparator 44, 45 and 46 has its output connected to one input of a function selection and control circuit 48 similar to circuit 18 of FIG. 1. The outputs of circuit 48 are applied to frequency divider 43.

It is clearly apparent that, in the case of FIG. 2, the reduction of power consumption is obtained with the help of gate circuit 39 which connects the key switches to the oscillator periodically for short time intervals.

Alternatively, the key switches can be energized by the battery of the watch. In that case, the coupling capacitors 10 (FIG. 1) and 40 (FIG. 2) are replaced by resistors. Touch-sensitive key switches having a resistive effect can also be used.

What I claim is:

1. An electronic watch comprising:
   A. oscillator means providing a standard oscillating signal and a feed signal;
   B. frequency divider means coupled to said oscillating signal for dividing said oscillating signal into a time signal having a lower frequency than said oscillating signal;
   C. time display means connected to said time signal for displaying time information in response thereto;
   D. at least one touch-sensitive key switch means for providing an activation signal in response to a human touch when coupled to said feed signal, said switch means being both stationary and contactless;
   E. time correction means coupled to said frequency divider means for changing the time displayed by the watch in response to the activation signal;
   F. means for producing a control signal; and
   G. gating means coupling said feed signal to said key switch means in response to the control signal 2. The electronic watch as claimed in claim 1 in which said means for producing a control signal are coupled to said frequency divider means and said control signal is derived from at least one stage of said frequency divider means.

3. The electronic watch as claimed in claim 1 in which said touch-sensitive key switch means are capacitive.

4. The electronic watch as claimed in claim 1 in which said means for producing a control signal include a second touch-sensitive key switch means permanently coupled with said oscillator means feed signal for producing said control signal in response to a human touch.

5. The electronic watch as claimed in claim 3 further including a watch crystal having an inner surface, and in which said touch-sensitive key switch means include an electrode located on the inner surface of the watch crystal and coupled to said gating means and receiving the feed signal therefrom, and comparator means coupled to said electrode for producing said activation signal in response to a change in said feed signal in said electrode caused by said human touch.

6. The electronic watch as claimed in claim 4 further including a watch crystal having an inner surface, and in which said second touch-sensitive key switch means include an electrode located on the inner surface of the watch crystal, and comparator means coupled to said electrode for producing said control signal in response to a change in said feed signal in said electrode caused by said human touch.

* * * * *